United States Patent

Boitnott et al.

[11] Patent Number: 5,855,465
[45] Date of Patent: *Jan. 5, 1999

[54] SEMICONDUCTOR WAFER PROCESSING CAROUSEL

[75] Inventors: Charles A. Boitnott, Half Moon Bay; James W. Caughran, Lodi; Steve Egbert, Palo Alto, all of Calif.

[73] Assignee: GaSonics International, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 633,366

[22] Filed: Apr. 16, 1996

[51] Int. Cl.⁶ ................................................. B65G 49/07
[52] U.S. Cl. .................... 414/222; 204/298.25; 414/331; 414/416; 414/937; 414/939
[58] Field of Search ..................... 414/217, 222, 414/331, 416, 937, 939; 204/298.25, 298.35; 118/719; 156/345

[56] References Cited

U.S. PATENT DOCUMENTS

| | | | |
|---|---|---|---|
| 3,981,791 | 9/1976 | Rosvold | 414/939 X |
| 4,382,739 | 5/1983 | Mack et al. | 414/939 X |
| 4,632,624 | 12/1986 | Mirkovich et al. | 414/939 X |
| 4,715,921 | 12/1987 | Maher et al. | 156/345 |
| 4,717,461 | 1/1988 | Strahl et al. | 414/939 X |
| 4,801,241 | 1/1989 | Zajac et al. | 414/939 X |
| 4,830,700 | 5/1989 | Davis et al. | 156/345 |
| 4,832,778 | 5/1989 | Davis et al. | 156/345 |
| 4,857,160 | 8/1989 | Landau et al. | 414/939 X |
| 4,906,328 | 3/1990 | Freeman et al. | 156/643.1 |
| 4,915,564 | 4/1990 | Eror et al. | 414/939 X |
| 4,915,777 | 4/1990 | Jucha et al. | 156/643.1 |
| 4,943,363 | 7/1990 | Zejda et al. | 414/222 X |
| 4,990,047 | 2/1991 | Wagner et al. | 414/939 X |
| 5,169,478 | 12/1992 | Miyamoto et al. | 156/345 |
| 5,205,919 | 4/1993 | Zejda | 204/298.25 |
| 5,281,295 | 1/1994 | Maeda et al. | 156/345 |
| 5,281,320 | 1/1994 | Turner et al. | 414/217 X |
| 5,292,393 | 3/1994 | Maydan et al. | 414/217 X |
| 5,302,209 | 4/1994 | Maeda et al. | 156/345 X |
| 5,308,431 | 5/1994 | Maher et al. | 156/345 |
| 5,308,989 | 5/1994 | Brubaker | 414/217 X |
| 5,310,410 | 5/1994 | Begin et al. | 414/217 X |
| 5,376,223 | 12/1994 | Salimian et al. | 156/643.1 |
| 5,628,828 | 5/1997 | Kawamura et al. | 414/217 X |
| 5,663,884 | 9/1997 | Nishihata et al. | 414/939 X |

FOREIGN PATENT DOCUMENTS

| | | | |
|---|---|---|---|
| 57-52138 | 3/1982 | Japan . | |
| 0287625 | 12/1987 | Japan . | |
| 2114528 | 4/1990 | Japan . | |
| 342816 | 2/1991 | Japan . | |
| 109727 | 5/1991 | Japan | 414/939 |
| 4124827 | 4/1992 | Japan . | |
| 0244515 | 5/1969 | Russian Federation . | |

*Primary Examiner*—David A. Bucci
*Attorney, Agent, or Firm*—Thomas E. Schatzel; Law Offices of Thomas E. Schatzel, a Prof. Corporation

[57] ABSTRACT

A semiconductor wafer processing carousel comprises an elevator chamber that accepts cassettes loaded with semiconductor wafers through a removable vacuum lock door, an elevator platform on which the cassettes ride up and down, an elevator drive to automatically position the elevator platform, a lid and a circular wafer handling chamber with an anteroom chamber connection to the elevator chamber. A double-axis wafer transfer arm provides for linear transfer through the anteroom chamber of selected wafers between the cassettes and a first pre-heating and cool-down process station within the circular wafer handling chamber. A multiple-spoke single-axis rigid-arm transfer carousel is centrally located within the circular wafer handling chamber and has access to multiple process stations. A set of independent cylindrical rings are positioned to rise up from the handling chamber bottom of the circular wafer handling chamber to contact and seal against the lid to isolate each of the process stations. A circular port with a diameter larger than the wafer is thus coupled from a detachable process reactor mounted on the lid down deep into the circular wafer handling chamber. The multiple-spoke single-axis rigid-arm transfer carousel is automatically positioned out of the way before the cylindrical rings are raised and sealed.

6 Claims, 9 Drawing Sheets

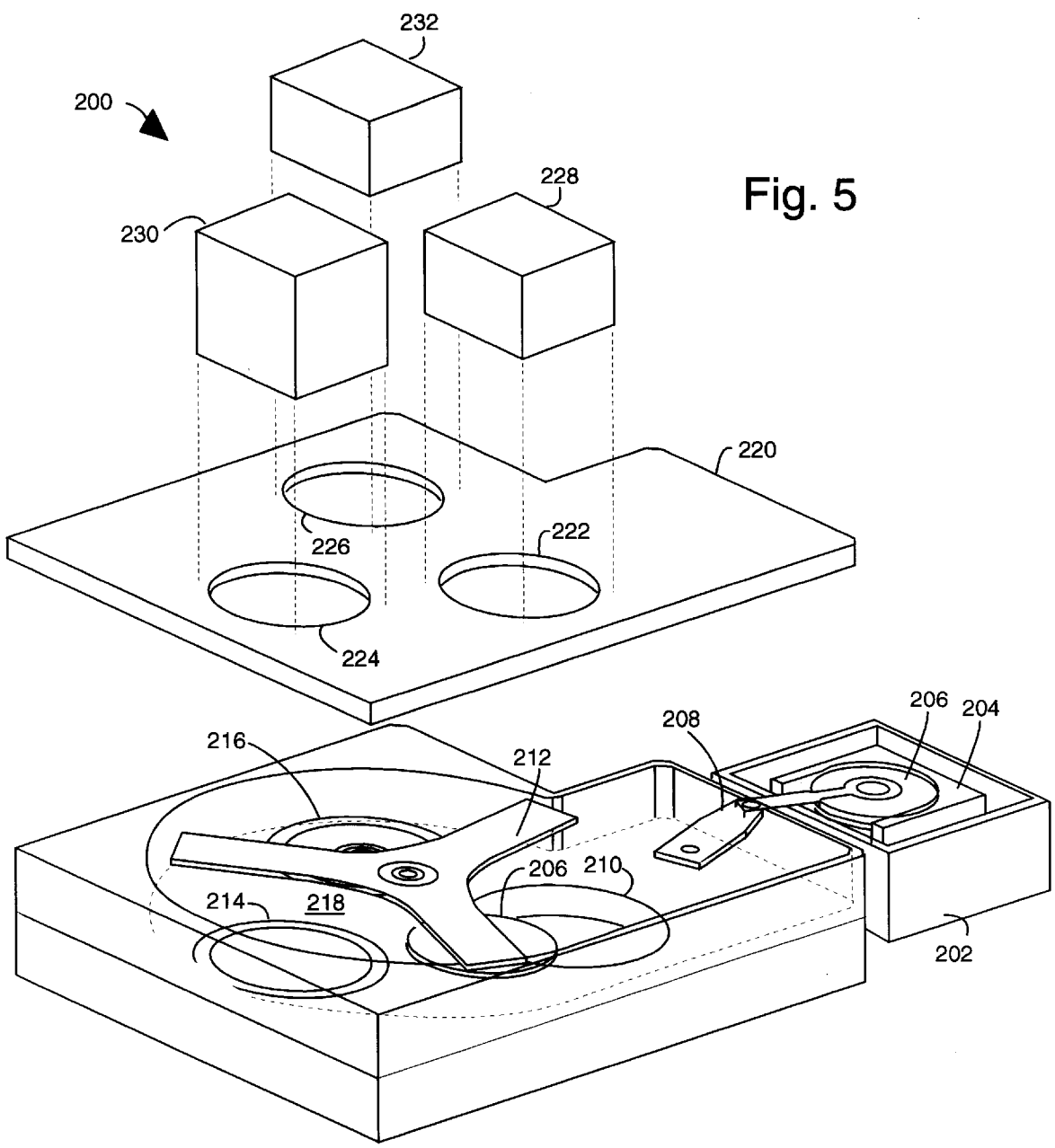

SEMICONDUCTOR WAFER PROCESSING CAROUSEL

BACKGROUND OF THE INVENTION

1. Field of the Invention

The invention relates generally to semiconductor processing equipment and more specifically to systems that permit the multiple processing of semiconductor wafers in a single cluster.

2. Description of the Prior Art

The fabrication of semiconductors and the handling of silicon wafers requires extreme cleanliness. Cleanrooms provide such clean environments, but are costly to construct and maintain. Therefore, each square foot in a cleanroom is very valuable and the semiconductor processing equipment placed in a cleanroom must make the most of the space it occupies by processing the wafers more effectively.

Cluster tools have evolved over the years that surround a wafer transfer arm, an endifector, with wafer cassette modules and process modules. The central cluster tool controller moves the wafers in and out of the various cassette and process modules. Such an arrangement can make for a very large assembly that consumes a lot of cleanroom space. The wafer transfer arm becomes a limiting factor in how fast wafers can be moved through the cluster tool. Since the single arm visits all the modules, contamination in one module can be distributed to all the modules.

SUMMARY OF THE PRESENT INVENTION

It is therefore an object of the present invention to provide a semiconductor processing cluster that provides for the efficient and clean transfer of wafers between processing stations.

It is a further object of the present invention to provide a semiconductor processing cluster that allows quick and easy changes to the sequence and type of process reactors that are used in a cluster.

It is a still further object of the present invention to provide a semiconductor processing cluster that allows quick and easy changes to the sequence and type of process reactors and that allows further flexibility in the positioning of wafer pre-heat and cooling stations within the sequence.

Briefly, a semiconductor wafer processing carousel embodiment of the present invention comprises an elevator chamber that accepts cassettes loaded with semiconductor wafers through a removable door, an elevator platform on which the cassettes ride up and down, an elevator drive to automatically position the elevator platform, a lid and a circular wafer handling chamber with an anteroom chamber connection to the elevator chamber, a double-axis wafer transfer arm for linear transfer through the anteroom chamber of selected wafers between the cassettes and a first pre-heating and cool-down process station within the circular wafer handling chamber, a multiple-spoke single-axis rigid-arm transfer carousel centrally located within the circular wafer handling chamber and having access to four process stations, and a set of independent cylindrical rings rise up from the handling chamber bottom of the circular wafer handling chamber to contact and seal against the lid to isolate each of the process stations. A circular port with a diameter larger than the wafer is thus coupled from a detachable process reactor mounted on the lid down deep into the circular wafer handling chamber. The multiple-spoke single-axis rigid-arm transfer carousel is automatically positioned out of the way before the cylindrical rings are raised and sealed.

An advantage of the present invention is that a wafer processing system is provided that supports high manufacturing throughputs.

A further advantage of the present invention is that a wafer processing system is provided that is flexible and provides high quality wafer processing.

Another advantage of the present invention is that a wafer transfer carousel is provided that moves several wafers at once between processing stations.

These and other objects and advantages of the present invention will no doubt become obvious to those of ordinary skill in the art after having read the following detailed description of the preferred embodiment which is illustrated in the drawing figures.

IN THE DRAWINGS

Figure 4:
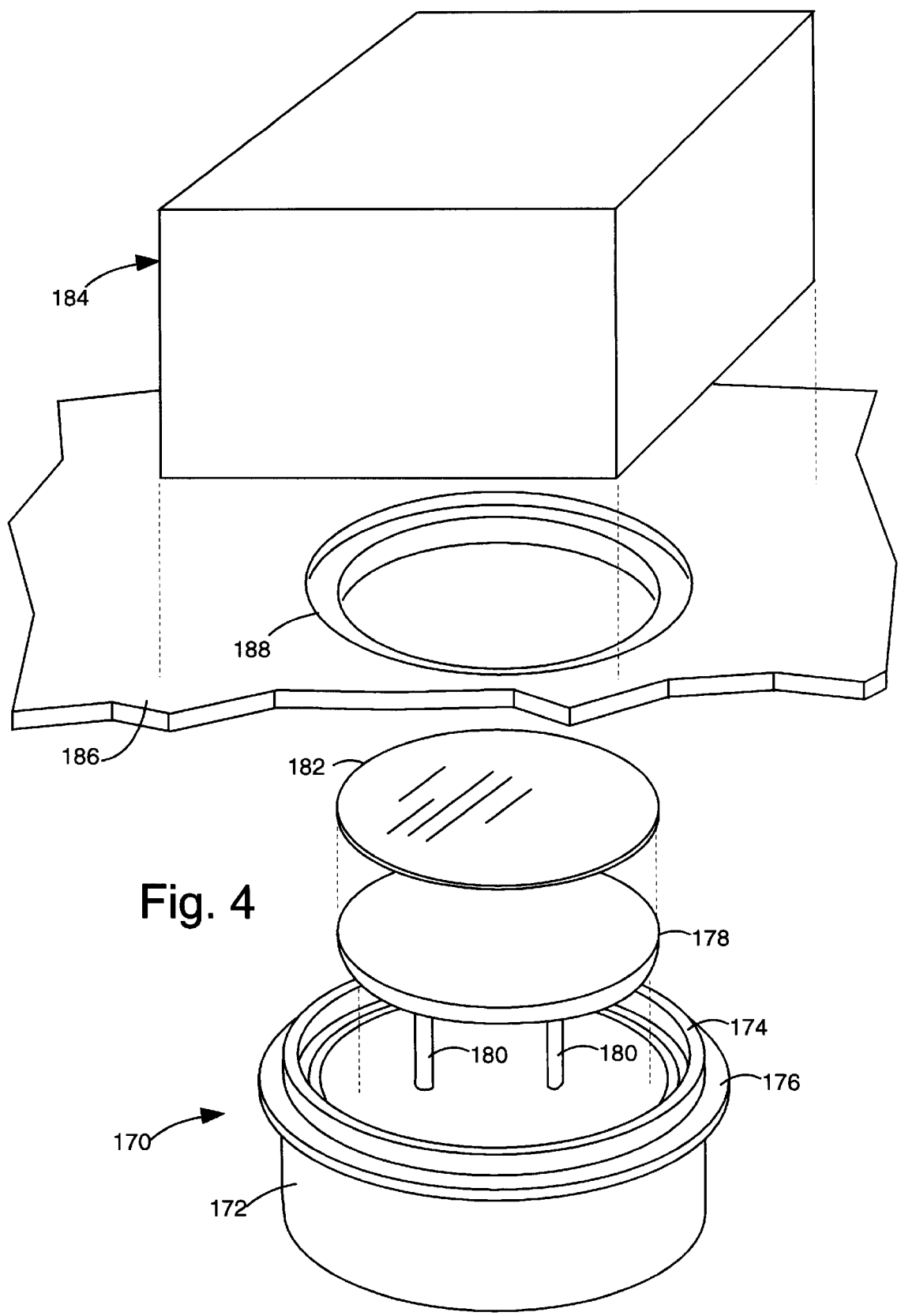

FIG. 4 is an exploded assembly diagram of a typical drop-in process module that includes an adapter that quick-clamps in the bottom of the handling chamber and a reactor that quick-clamps to the handling chamber lid to respectively configure a processing station bottom and top chamber. Such portions are then robotically sealed together by a sleeve that rises out of the adapter and through the handling chamber gap to the bottom of the lid where it seals to hold a vacuum; and FIG. 5 is a three dimensional exploded view sketch of a three-station wafer-processing cluster of the present invention.

DETAILED DESCRIPTION OF THE PREFERRED EMBODIMENTS

Figure 1A:
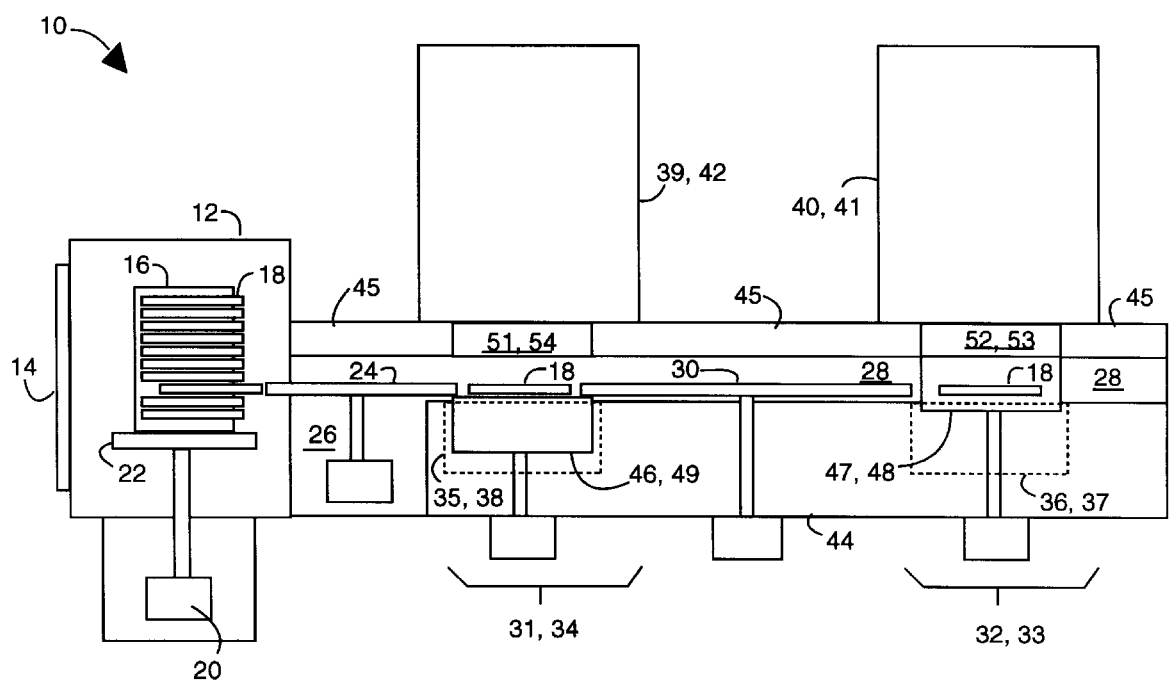
FIG. 1A is a mechanical schematic diagram in side view of a four-cluster modular wafer processing system of the present invention with a single cassette and elevator chamber for unprocessed and processed wafers and that shows wafers in their respective station positions ready for processing.
Figure 1B:
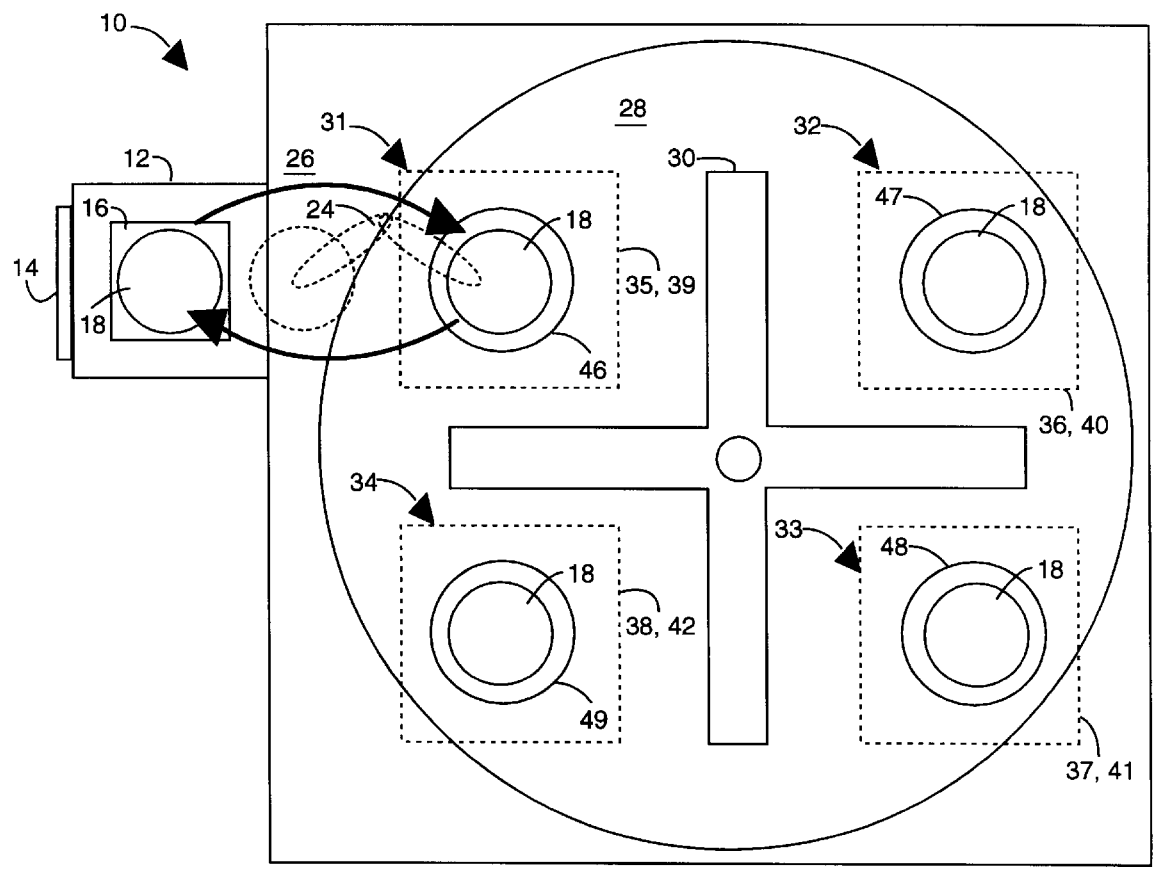
FIG. 1B is a mechanical schematic diagram in plan view of the four-cluster modular wafer processing system of FIG. 1A with the wafer transfer carousel empty and in its idle position out of the way of the processing stations.
Figure 1C:
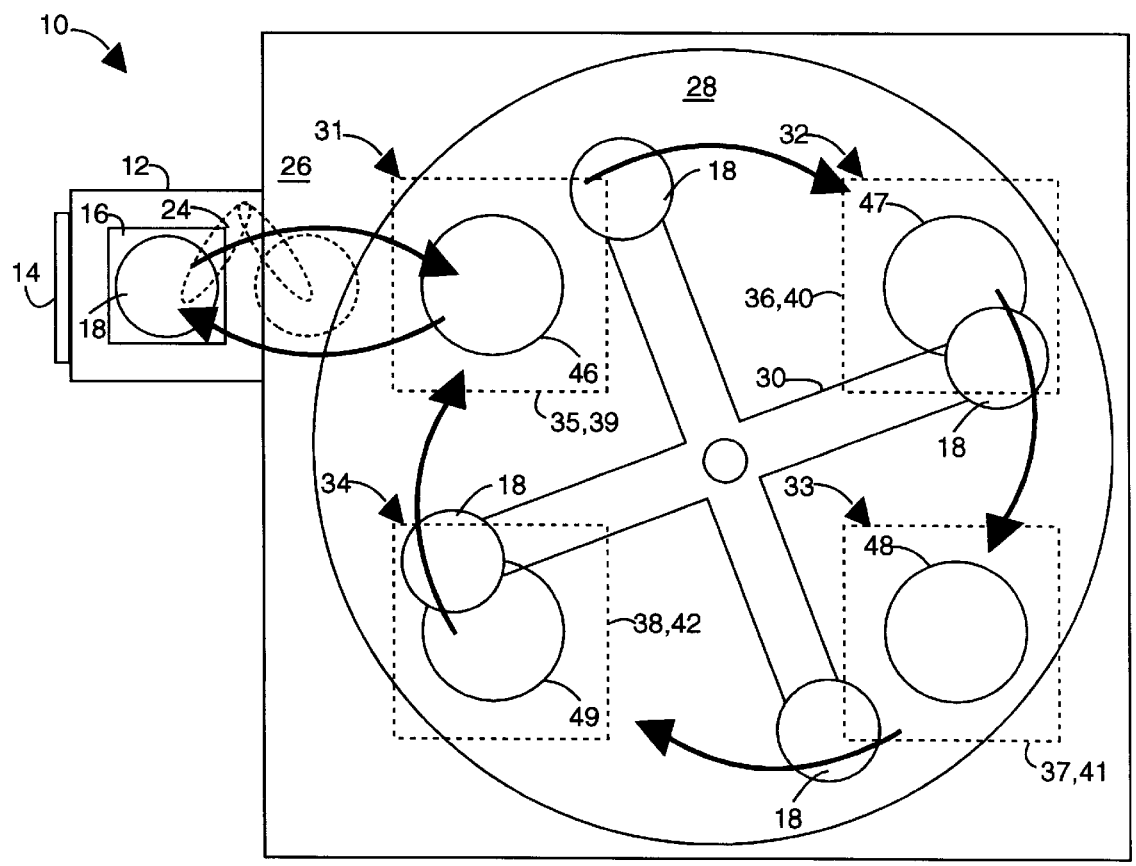
FIG. 1C is a mechanical schematic diagram in plan view of the four-cluster modular wafer processing system of FIG. 1A with the wafer transfer carousel having rotated counter-clockwise to fetch a wafer from each processing station and then rotating clockwise to deposit the wafer at the next adjacent clockwise station position.

FIGS. 1A, 1B, and 1C illustrate a four-cluster modular wafer processing system embodiment of the present invention, referred to herein by the general reference numeral 10. The system 10 comprises a wafer elevator chamber 12 with a vacuum seal door 14 for receiving a cassette 16 of semiconductor wafers 18. An elevator drive 20 raises and lowers an elevator platform 22 to select a particular wafer 18 for transfer by a double-axis arm 24 in an anteroom chamber 26. A circular wafer handling chamber 28 includes a multiple-spoke single-axis rigid-arm transfer carousel 30 that oscillates to transfer wafers 18 between a set of four processing station positions 31–34 that each comprise a modular bottom 35–38 and top module 39–42.

A handling chamber bottom 44 and a matching lid 45 provide a vacuum seal for the volume of the circular wafer handling chamber 28. The modular bottoms 35–38 quick-clamp into standardized reliefs in the handling chamber bottom 44 when the lid 45 is removed. The top modules 39–42 quick-clamp to matching standardized reliefs in the handling chamber lid 45. A set of four cylindrical metal sleeves 46–49, each with top and bottom O-ring seals, include actuators that raise and lower the sleeves 46–49 independently, or in unison, to individually seal together the module bottoms 35–38 to their respective module tops 39–42.

FIG. 1A shows the cylindrical metal sleeves 46 and 49 in their lowered position and the cylindrical metal sleeves 47 and 48 in their raised and sealed position with a wafer 18 inside the resulting chamber ready for processing. The cylindrical metal sleeves 46–49 are lowered to allow the transfer of wafers 18 between adjacent processing stations 31–34 by the wafer transfer carousel 30. The cylindrical metal sleeves 46–49 are raised and sealed to allow the wafers 18 to be exposed through a corresponding port 51–54 to a particular removable process module tops 39–42.

Each of the four processing station positions 31–34 can be independently populated with wafer heating and cooldown, etching, ashing & cleaning, chemical vapor deposition (CVD), physical vapor deposition (PVD), and other types of hot and cold semiconductor process modules in paired top and bottom parts.

Any of the four processing station positions 31–34 may receive conventional semiconductor process reactors for photoresist removal, cleaning, plasma etching, sputtering, vapor deposition, and/or the deposition on uniform silicon nitride films on large sized wafers. For example, a wafer 18 is placed in a deposition zone and a process gas comprising a silicon containing gas and a nitrogen containing gas is introduced into the deposition zone through an inlet gas conduit. The wafer 18 is heated to a temperature $T_d$ that is sufficiently high to cause the process gas to deposit silicon nitride on the wafer 18, with the resultant formation of process gas byproducts. The process gas byproducts are exhausted through an exhaust gas conduit.

As further example, any of the four processing station positions 31–34 may receive a conventional semiconductor process reactor for physical vapor deposition (PVD), or sputtering. Such stations may be used to deposit a metallic layer on the surface of the silicon wafer 18. PVD is frequently used to deposit metallic layers of Ti for contacts and metallic layers of Al for interconnects. PVD can also be used to deposit TiN as a barrier layer on silicon wafers. In a PVD process, inert gas particles are first ionized in an electric field to produce a gas plasma. The ionized particles are then directed toward a source or target where the energy of these gas particles physically dislodges, or sputters off, atoms of the metallic source material. Many materials can be deposited using not only RF but also DC power sources. In a typical PVD process chamber, major components include a vacuum-tight stainless steel chamber with a helium leak detector, a pumping capacity that is capable of reducing the chamber pressure to about $10^{-6}$ torr or below, pressure gauges, a sputter source or target, a power supply, and a wafer holder. The sputter source and the wafer holder in the module bottom 35–38 are normally positioned facing each other. The target is, for example, an Al or Ti disc used as the sputter source for the process. Target sizes of thirteen-inches (330 mm) are normally used for processing eight-inch (200 mm) wafers. The target is bonded to a backing plate and has a life expectancy that depends on the power consumption of the process and the target material used.

A typical single-wafer cold-wall CVD chamber is radiantly heated to enable precise temperature control in the range of 500° to 1,000° C. The wafer is mounted on a susceptor, which is a silicon carbide coated graphite disc, to receive uniform deposition of materials on the wafer surface. The susceptor may be rotated by a motor during deposition to further improve the uniformity of the coating. This type of thermal reactor for semiconductor processing provides for high-throughput, flexible thermal control, and process uniformity for large wafers at ambient and reduced pressures. Reactant gases enter the CVD chamber and produce films of various electronic materials on the surface of a wafer for various purposes such as for metalization layers, for dielectric layers, for insolation layers, etc. The various electronic materials deposited include spitaxial silicon, polysilicon, silicon nitride, silicon oxide, and refractory metals such as titanium, tungsten and their silicides. In these film deposition processes, most of the material from the reactive gases is deposited on the wafer surface. However, it is inevitable that a small amount of the material is deposited on heated surfaces inside the chamber other than that of the wafer. This also occurs in a cold-wall CVD system in which the chamber wall is kept cool by the circulation of cooling air outside the chamber to avoid deposition of materials on the wall.

The carousel 30 does not make complete rotations, it is limited, for example, to ±45° rotation back and forth from the position shown in FIG. 1B. Therefore, only a single arm will come into contact with any two adjacent processing stations 31–34. Such back and forth rotation, like an oscillating agitator in a washing machine, helps to reduce the amount of contamination that can exchange between the processing stations while moving a queue of wafers through the system.

FIG. 1C shows the transfer carousel 30 in operation. Wafers 18 are shown transferring clockwise between the four process stations 31–34. The double-axis arm 24 in the anteroom chamber 26 is shown transferring wafers between the cassette 16 and the process station 31.

Figure 2A:
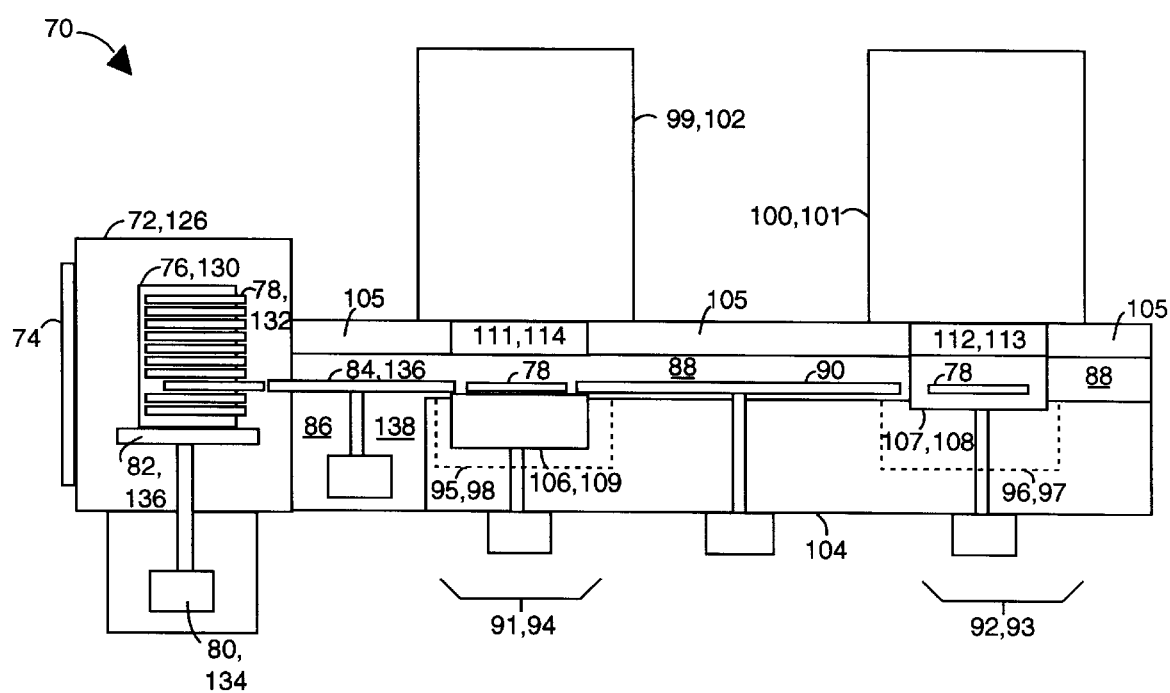
FIG. 2A is a mechanical schematic diagram in side view of a four-cluster modular wafer processing system of the present invention with separate unprocessed and processed wafer cassettes and loading chambers and that shows wafers in their respective station positions ready for processing.
Figure 2B:
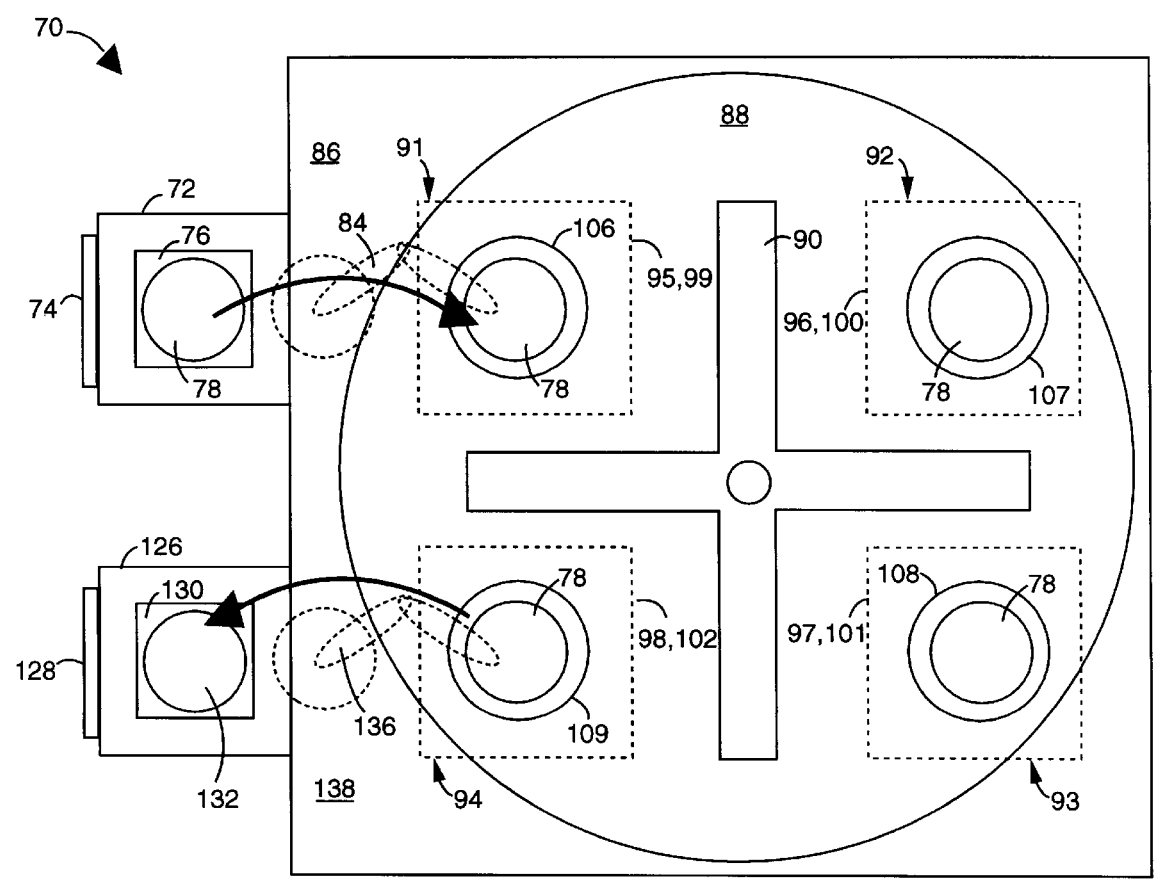
FIG. 2B is a mechanical schematic diagram in plan view of the four-cluster modular wafer processing system of FIG. 2A with the wafer transfer carousel empty and in its idle position out of the way of the processing stations.
Figure 2C:
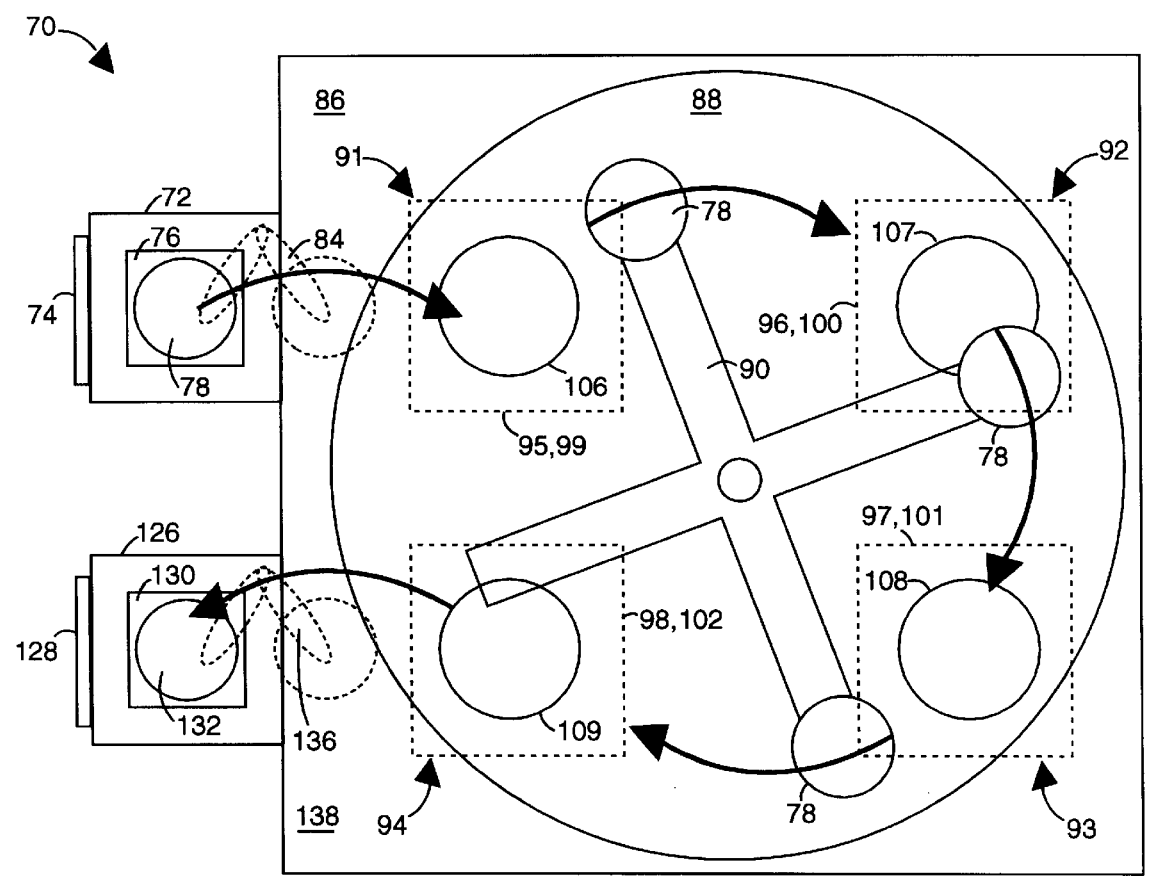
FIG. 2C is a mechanical schematic diagram in plan view of the four-cluster modular wafer processing system of FIG. 2A with the wafer transfer carousel having rotated counter-clockwise to fetch a wafer from each processing station and then rotating clockwise to deposit the wafer at the next adjacent clockwise station position.

FIGS. 2A, 2B, and 2C illustrate a four-cluster modular wafer processing system embodiment of the present invention, referred to herein by the general reference numeral 70. The system 70 is similar to the system 10 and comprises an unprocessed wafer elevator chamber 72 with a vacuum seal door 74 for receiving a cassette 76 of unprocessed semiconductor wafers 78. An elevator drive 80 raises and lowers an elevator platform 82 to select a particular wafer 78 for transfer by a double-axis arm 84 in an anteroom chamber 86. A circular wafer handling chamber 88 includes a multiple-spoke single-axis rigid-arm transfer carousel 90 that oscillates between a set of adjacent processing stations 91–94 to transfer wafers 78 around in a clockwise moving queue. Each of the processing stations 91–94 respectively comprises a bottom 95–98 and a top 99–102. A handling chamber bottom 104 and a lid 105 provide a vacuum seal for the circular wafer handling chamber 88. A set of four cylindrical metal sleeves 106–109 each with top and bottom O-ring seals raise and lower independently or in unison to seal each respective area for process stations 91–94 from the handling chamber bottom 104 to the lid 105.

FIG. 2A shows the cylindrical metal sleeves 106 and 109 in their lowered position and the cylindrical metal sleeves 107 and 108 in their raised and sealed position. The cylindrical metal sleeves 106–109 are lowered to allow the transfer of wafers 78 between the processing stations 91–94. The cylindrical metal sleeves 106–109 are raised and seared to allow the wafers 78 to be exposed through a corresponding port 111–114 to a particular removable process modules 99–102. For example, the process modules 99–102 may comprise conventional semiconductor process reactors for photo resist removal, cleaning, plasma etching, sputtering, vapor deposition, etc.

The system 70 comprises a processed wafer elevator chamber 126 with a vacuum seal door 128 for outputting a cassette 130 of processed semiconductor wafers 132. An elevator drive 134 raises and lowers an elevator platform 136 to select a spot for a particular processed wafer 132 transferred out by a double-axis arm 136 in an anteroom chamber 138.

FIG. 2C shows the transfer carousel 90 in the act of wafer transfer. Unprocessed wafers 78 are shown transferring clockwise between the four process stations 91–94 and are output as processed wafers 132. The double-axis arm 84 in the anteroom chamber 86 is shown transferring wafers in from the cassette 76 to the process station 91. The double-axis arm 136 in the anteroom chamber 138 is shown transferring processed wafers 132 out to the cassette 130 from the process station 94. Such separation of input and output wafers allows a higher throughput.

Figure 3:
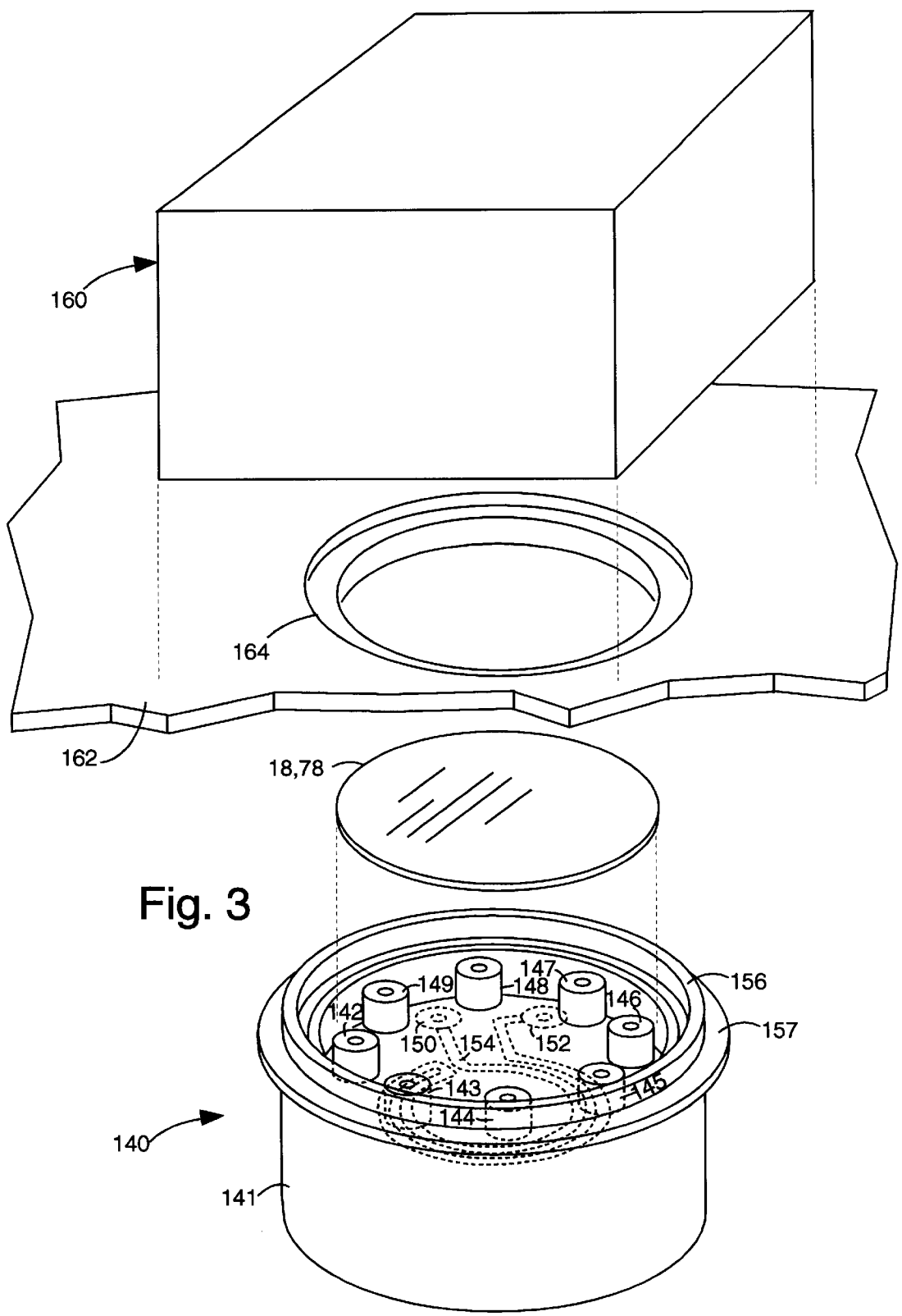
FIG. 3 is an exploded assembly diagram of the wafer preheating and cooling station top and bottom pair that may be quickly installed in any of the first few station positions. Such portions are then automatically sealed together by a sleeve that rises out of the adapter and through the handling chamber gap to the bottom of the lid where it seals to hold a vacuum.

FIG. 3 shows a wafer preheating and cooling station bottom 140 for use in any one of the processing station of the four-cluster modular wafer processing systems 10 and 70 (FIGS. 1A–1C and 2A–2C). For example, wafers 18 and 78 may be preheated at stations 31 and 91 in preparation for further processing at stations 32–34 and 92–94. The station bottom 140 comprises an adapter 141 with standardized dimensions for quick removal and replacement in the wafer handling chamber bottom with quick-clamps. A set of eight optical sensors 142–149 are used to determine the position of wafers 18 and 78 within the station bottom. A pair of fittings 150 and 152 connect to a folded-spiral cooling liquid channel 154. A metal cylindrical sleeve 156 is proportioned to fit within the station bottom and to be moveable between a flush position in the adapter 141 and an extended position that seals with a bottom O-ring against a compliant seal 157. A module top 160, equivalent to module tops 39–42 and 99–102, quick-clamps to a wafer handling chamber lid 162, which represents lids 45 and 105. In this case for a heating station, the module 160 comprises high-power quartz heating lamps. A port 164, which represents ports 51–54 and 111–114, provides access for the module top 160 to the wafer 18, 78 through a vacuum barrier window. The sleeve 156 typically extends out three-quarters of an inch to engage the bottom of lid 162 around port 164 with another O-ring seal. Variations in the inside dimension vertically through the wafer handling chamber at each processing station are accommodated by the flexibility of the compliant ring 157.

FIG. 4 shows a wafer processing station bottom 170 for use in any one of the processing station of the four-cluster modular wafer processing systems 10 and 70 (FIGS. 1A–1C and 2A–2C). For example, wafers 18 and 78 may be processed at stations 32–34 and 92–94. The station bottom 170 comprises an adapter 172 with standardized dimensions for quick removal and replacement in the wafer handling chamber bottom with quick-clamps. A metal cylindrical sleeve 174 is proportioned to fit within the station bottom and to be moveable between a flush position in the adapter 172 and an extended position that seals with a bottom O-ring against a compliant seal 176. As an example of what is possible in the kinds of modules that can be used, a cold platen 178 is included that is connected with a pair of pipes 180 to a circulating chilled water system. The platen 178 is used to keep a wafer 182 cold during certain kinds of processing. For example, wafer 182 is equivalent to wafers 18 and 78. A module top 184, equivalent to module tops 39–42 and 99–102, quick-clamps to a wafer handling chamber lid 186, which represents lids 45 and 105. In this case for a processing station, the module 184 comprises a plasma reactor. A port 188, which represents ports 51–54 and 111–104, provides access for the module top 184 to the wafer 182. The sleeve 174 typically extends out three-quarters of an inch to engage the bottom of lid 186 around port 188 with another O-ring seal. Variations in the inside dimension vertically through the wafer handling chamber at each processing station are accommodated by the flexibility of the compliant ring 176.

The present invention is not limited to clusters of four processing station positions with carousels having four spoked arms. For example, three may be used as sketched in perspective in FIG. 5. As few as two stations may be used. The upper limit of the number of stations possible is in the hundreds, especially if the rigid spoked arm carousel is substituted with a conveyor system.

FIG. 5 shows a wafer processing system 200 that is similar to the four-cluster modular wafer processing systems 10 and 70, except that three processing stations are provided. The system 200 includes an elevator chamber 202 that vacuum locks a cassette 204 of wafers 206. A double-axis wafer transfer arm 208 shuttles unprocessed wafers 206 to a first processing station bottom 210, e.g., for pre-heating. The double-axis wafer transfer arm 208 shuttles processed wafers 206 from the first processing station bottom 210 back to the cassette 204, e.g., after a cool-down. A three-spoke carousel 212 simultaneously can move wafers 206 in a circuit amongst the first processing station bottom 210 and a second processing station bottom 214 and a third processing station bottom 216. The three-spoke carousel 212 rotates in a circular chamber 218 and is enclosed in a gas-tight environment by a lid 220 with a set of three ports 222, 224, and 226. A first process reactor 228 attaches and seals to the lid 220 at the first port 222. A second process reactor 230 attaches and seals to the lid 220 at the second port 224. A third process reactor 232 attaches and seals to the lid 220 at the third port 226. During each process operation, a sleeve, similar to sleeve 156 in FIGS. 3 and 4, rises from wells 210, 214 and 216 to respectively seal against ports 222, 224 and 226.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modular wafer processing system, comprising:

a circular wafer handling chamber with a detachable lid that provides a mounting platform with a plurality of process-reactor circular ports for a plurality of interchangeable processing modules;

an anteroom chamber connected to one side of the circular wafer handling chamber and including a double-axis wafer transfer arm for linearly transferring through the anteroom chamber a plurality of semiconductor wafers each with diameters less than any of said plurality of process-reactor circular ports;

an elevator chamber accessible to said double-axis wafer transfer arm and that accepts a cassette loaded with a plurality of said semiconductor wafers through a removable door including an elevator platform on which said cassettes ride up and down, and an elevator drive to automatically position said elevator platform;

a plurality of equally distributed processing stations each associated with a corresponding one of said plurality of interchangeable processing modules and each intersecting the circular wafer handling chamber, wherein a first one of said plurality of equally distributed processing stations is accessible to said double-axis wafer transfer arm providing for an exchange of said semiconductor wafers between said first processing station and said cassette in the elevator chamber;

a multiple-spoke single-axis rigid-arm transfer carousel centrally located within the circular wafer handling chamber and having access to every one of said plurality of equally distributed processing stations and providing for a clockwise or counterclockwise transfer of said semiconductor wafers between adjacent ones of the plurality of equally distributed processing stations; and means for parking the multiple-spoke single-axis rigid-arm transfer carousel with its arm spokes at positions between each of the plurality of equally distributed processing stations.

2. A modular wafer processing system, comprising:

a circular wafer handling chamber with a detachable lid that provides a mounting platform with a plurality of process-reactor circular ports for a plurality of interchangeable processing modules;

an anteroom chamber connected to one side of the circular wafer handling chamber and including a double-axis wafer transfer arm for linearly transferring through the anteroom chamber a plurality of semiconductor wafers each with diameters less than any of said plurality of process-reactor circular ports;

an elevator chamber accessible to said double-axis wafer transfer arm and that accepts a cassette loaded with a plurality of said semiconductor wafers through a removable door including an elevator platform on which said cassettes ride up and down, and an elevator drive to automatically position said elevator platform;

a plurality of equally distributed processing stations each associated with a corresponding one of said plurality of interchangeable processing modules and each intersecting the circular wafer handling chamber, wherein a first one of said plurality of equally distributed processing stations is accessible to said double-axis wafer transfer arm providing for an exchange of said semiconductor wafers between said first processing station and said cassette in the elevator chamber;

a multiple-spoke single-axis rigid-arm transfer carousel centrally located within the circular wafer handling chamber and having access to every one of said plurality of equally distributed processing stations and providing for a clockwise or counterclockwise transfer of said semiconductor wafers between adjacent ones of the plurality of equally distributed processing stations; and a cylindrical metal sleeve with top and bottom end ring seals disposed at one of the plurality of equally distributed processing stations and having means for raising and sealing the cylindrical metal sleeve with top and bottom end ring seals between a handling chamber bottom of the circular wafer handling chamber and the detachable lid, wherein the interior of said processing station can be isolated from the remaining interior of the circular wafer handling chamber.

3. A modular wafer processing system, comprising:

a circular wafer handling chamber with a detachable lid that provides a mounting platform with a plurality of process-reactor circular ports for a plurality of interchangeable processing modules;

an anteroom chamber connected to one side of the circular wafer handling chamber and including a double-axis wafer transfer arm for linearly transferring through the anteroom chamber a plurality of semiconductor wafers each with diameters less than any of said plurality of process-reactor circular ports;

an elevator chamber accessible to said double-axis wafer transfer arm and that accepts a cassette loaded with a plurality of said semiconductor wafers through a removable door including an elevator platform on which said cassettes ride up and down, and an elevator drive to automatically position said elevator platform;

a plurality of equally distributed processing stations each associated with a corresponding one of said plurality of interchangeable processing modules and each intersecting the circular wafer handling chamber, wherein a first one of said plurality of equally distributed processing stations is accessible to said double-axis wafer transfer arm providing for an exchange of said semiconductor wafers between said first processing station and said cassette in the elevator chamber;

a multiple-spoke single-axis rigid-arm transfer carousel centrally located within the circular wafer handling chamber and having access to every one of said plurality of equally distributed processing stations and providing for a clockwise or counterclockwise transfer of said semiconductor wafers between adjacent ones of the plurality of equally distributed processing stations; and a plurality of cylindrical metal sleeves with top and bottom end ring seals each disposed at every one of the plurality of equally distributed processing stations and having means for independently raising and sealing each cylindrical metal sleeve with top and bottom end ring seals between a handling chamber bottom of the circular wafer handling chamber and the detachable lid, wherein the interior of each respective processing station can be isolated from the others and the remaining interior of the circular wafer handling chamber.

4. A modular wafer processing system, comprising:

a circular wafer handling chamber with a detachable lid that provides a mounting platform with a plurality of process-reactor circular ports for a plurality of interchangeable processing modules;

an anteroom chamber connected to one side of the circular wafer handling chamber and including a double-axis wafer transfer arm for linearly transferring through the anteroom chamber a plurality of semiconductor wafers each with diameters less than any of said plurality of process-reactor circular ports;

an elevator chamber accessible to said double-axis wafer transfer arm and that accepts a cassette loaded with a plurality of said semiconductor wafers through a removable door including an elevator platform on which said cassettes ride up and down, and an elevator drive to automatically position said elevator platform;

a plurality of equally distributed processing stations each associated with a corresponding one of said plurality of interchangeable processing modules and each intersecting the circular wafer handling chamber, wherein a first one of said plurality of equally distributed processing stations is accessible to said double-axis wafer transfer arm providing for an exchange of said semiconductor wafers between said first processing station and said cassette in the elevator chamber;

a multiple-spoke single-axis rigid-arm transfer carousel centrally located within the circular wafer handling chamber and having access to every one of said plurality of equally distributed processing stations and providing for a clockwise or counterclockwise transfer of said semiconductor wafers between adjacent ones of the plurality of equally distributed processing stations;

means for parking the multiple-spoke single-axis rigid-arm transfer carousel with its arm spokes at positions between each of the plurality of equally distributed processing stations; and a cylindrical metal sleeve with top and bottom end ring seals disposed at one of the plurality of equally distributed processing stations and having means for raising and sealing the cylindrical metal sleeve between a handling chamber bottom of the circular wafer handling chamber and the detachable lid, wherein the interior of said processing station can be isolated from the remaining interior of the circular wafer handling chamber.

5. The system of claim 4, wherein:

the sleeve has an inside diameter larger than the diameter of said wafers.

6. A modular wafer processing system, comprising:

a circular wafer handling chamber with a detachable lid that provides a mounting platform with a plurality of process-reactor circular ports for a plurality of interchangeable processing modules;

an anteroom chamber connected to one side of the circular wafer handling chamber and including a double-axis wafer transfer arm for linearly transferring through the anteroom chamber a plurality of semiconductor wafers each with diameters less than any of said plurality of process-reactor circular ports;

an elevator chamber accessible to said double-axis wafer transfer arm and that accepts a cassette loaded with a plurality of said semiconductor wafers through a removable door including an elevator platform on which said cassettes ride up and down, and an elevator drive to automatically position said elevator platform;

a plurality of equally distributed processing stations each associated with a corresponding one of said plurality of interchangeable processing modules and each intersecting the circular wafer handling chamber, wherein a first one of said plurality of equally distributed processing stations is accessible to said double-axis wafer transfer arm providing for an exchange of said semiconductor wafers between said first processing station and said cassette in the elevator chamber;

a multiple-spoke single-axis rigid-arm transfer carousel centrally located within the circular wafer handling chamber and having access to every one of said plurality of equally distributed processing stations and providing for a clockwise or counterclockwise transfer of said semiconductor wafers between adjacent ones of the plurality of equally distributed processing stations;

means for parking the multiple-spoke single-axis rigid-arm transfer carousel with its arm spokes at positions between each of the plurality of equally distributed processing stations; and a plurality of cylindrical metal sleeves each with top and bottom end ring seals and each disposed at different ones of the plurality of equally distributed processing stations and having means for independently raising and sealing each cylindrical metal sleeve between a handling chamber bottom of the circular wafer handling chamber and the detachable lid, wherein the interior of each respective processing station can be isolated from the others and the remaining interior of the circular wafer handling chamber.

* * * * *